(12) United States Patent
Ohashi et al.

(10) Patent No.: US 12,567,571 B2
(45) Date of Patent: Mar. 3, 2026

(54) METHOD OF MANUFACTURING SEMICONDUCTOR DEVICE

(71) Applicant: Kokusai Electric Corporation, Tokyo (JP)

(72) Inventors: Naofumi Ohashi, Toyama (JP); Shun Matsui, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 828 days.

(21) Appl. No.: 17/474,714

(22) Filed: Sep. 14, 2021

(65) Prior Publication Data

US 2022/0102114 A1     Mar. 31, 2022

(30) Foreign Application Priority Data

Sep. 25, 2020     (JP) ................................. 2020-160828

(51) Int. Cl.
H01L 21/31          (2006.01)
C23C 16/34          (2006.01)
(Continued)

(52) U.S. Cl.
CPC ........ H01J 37/3299 (2013.01); C23C 16/345 (2013.01); C23C 16/45565 (2013.01);
(Continued)

(58) Field of Classification Search
CPC ................................ H01L 21/31; H01L 21/20
See application file for complete search history.

(56) References Cited

U.S. PATENT DOCUMENTS 5,958,140 A     9/1999  Arami et al.
6,218,320 B1 *  4/2001  Lu ....................... C23C 16/5096
                                                      257/E21.279
(Continued)

FOREIGN PATENT DOCUMENTS

JP            0945624 A      2/1997
JP        2008223130 A  *   9/2008
(Continued)

OTHER PUBLICATIONS

Song et al. KR20200023810A translation. Mar. 6, 2020 (Year: 2020).*

(Continued)

*Primary Examiner* — Cachet I Proctor
(74) *Attorney, Agent, or Firm* — Volpe Koenig

(57)          ABSTRACT

Described herein is a technique capable of uniformizing a quality of a film even when a processing environment changes. According to one aspect thereof, there is provided a method of manufacturing a semiconductor device, including: (a) loading a substrate into a process chamber; (b) supplying a gas to the substrate in the process chamber through a dispersion plate of a shower head while heating the dispersion plate by a shower head heater and exhausting the gas; (c) unloading the substrate; (d) measuring a temperature of the shower head before loading a subsequent substrate; and (e) comparing the temperature of the shower head after (d) with a pre-set temperature, and operating the shower head heater to control the temperature of the shower head to become close to the pre-set temperature when a difference between the temperature of the shower head and the pre-set temperature is greater than a predetermined value.

16 Claims, 9 Drawing Sheets

(51) Int. Cl.

| | |
|---|---|
| *C23C 16/455* | (2006.01) |
| *C23C 16/458* | (2006.01) |
| *C23C 16/48* | (2006.01) |
| *C23C 16/52* | (2006.01) |
| *H01J 37/32* | (2006.01) |
| *H01L 21/02* | (2006.01) |
| *H01L 21/20* | (2006.01) |
| *H01L 21/66* | (2006.01) |

(52) U.S. Cl.

CPC .......... *C23C 16/4586* (2013.01); *C23C 16/48* (2013.01); *C23C 16/52* (2013.01); *H01J 37/3244* (2013.01); *H01J 37/32532* (2013.01); *H01J 37/32715* (2013.01); *H01J 37/32853* (2013.01); *H01L 21/0217* (2013.01); *H01L 21/02274* (2013.01); *H01L 22/20* (2013.01); *H01J 2237/3321* (2013.01); *H01J 2237/3323* (2013.01)

(56) References Cited

U.S. PATENT DOCUMENTS

| | | | | |
|---|---|---|---|---|
| 2002/0034862 | A1* | 3/2002 | Wada | H01L 21/67109 |
| | | | | 438/484 |
| 2009/0111276 | A1* | 4/2009 | Dhindsa | G05D 23/192 |
| | | | | 700/121 |
| 2011/0303641 | A1* | 12/2011 | Mahadeswaraswamy | |
| | | | | H01L 21/67248 |
| | | | | 156/345.52 |

| | | | | |
|---|---|---|---|---|
| 2015/0001181 | A1* | 1/2015 | Ogi | H01J 37/32532 |
| | | | | 156/345.27 |
| 2015/0132863 | A1* | 5/2015 | Oohashi | H01J 37/32935 |
| | | | | 438/5 |
| 2016/0293500 | A1* | 10/2016 | Ohashi | H01L 21/76801 |
| 2017/0092518 | A1 | 3/2017 | Takano | |
| 2018/0366354 | A1 | 12/2018 | Nguyen et al. | |
| 2019/0040529 | A1* | 2/2019 | Verbaas | C23C 16/4557 |
| 2020/0051789 | A1* | 2/2020 | Linebarger, Jr. | G01K 15/005 |
| 2020/0051838 | A1* | 2/2020 | Itatani | C23C 16/52 |

FOREIGN PATENT DOCUMENTS

| | | | | |
|---|---|---|---|---|
| JP | 2012-054399 | A | | 3/2012 |
| JP | 2017-054103 | A | | 3/2017 |
| JP | 2020-025024 | A | | 2/2020 |
| JP | 2020-524393 | A | | 8/2020 |
| KR | 20200023810 | A | * | 3/2020 |
| TW | 201712781 | A | | 4/2017 |
| WO | 2020/033304 | A1 | | 2/2020 |

OTHER PUBLICATIONS

Japanese Office Action issued on Jul. 26, 2022 for Japanese Patent Application No. 2020-160828.

Japanese Office Action issued on Jan. 10, 2023 for Japanese Patent Application No. 2020-160828.

Taiwan Office Action issued on Aug. 23, 2022 for Taiwan Patent Application No. 110132195.

SIPO's Office Action issued on Oct. 29, 2024 for China Patent Application No. 202110971630.3.

* cited by examiner

| LOT SERIAL NUMBER | SH TEMPERATURE INFORMATION | | | | | | | | |
|---|---|---|---|---|---|---|---|---|---|
| | SUBSTRATE SERIAL NUMBER | | | | | | | | |
| | S-1 | S-2 | S-3 | | S-(m-2) | S-(m-1) | S-m | ... |
| 1 | - | - | - | | - | - | 253 | - |
| 2 | - | - | - | | - | - | 254 | - |
| 3 | - | - | - | | - | - | 254 | - |
| ... | | | | | | | | |
| n-1 | - | - | - | | - | - | 255 | - |
| n | - | - | - | | 252 | | | |
| n+1 | - | - | - | | - | - | 253 | - |
| ... | | | | | | | | |

| LOT SERIAL NUMBER PROCESSED IMMEDIATELY BEFORE CURRENT LOT | SH TEMPERATURE INFORMATION |
|---|---|
| 1 | 249 |
| 2 | 247 |
| 3 | 237 |
| . . . | . . . |
| n-1 | 228 |
| n | 244 |
| n+1 | 250 |
| . . . | . . . |

| TEMPERATURE DIFFERENCE Δt | CONTROL VALUE OF HEATER 271a | CONTROL VALUE OF HEATER 271b | CONTROL VALUE OF HEATER 271c |
|---|---|---|---|
| Δt ≤ 5 | Ca0 | Cb0 | Cc0 |
| 5 < Δt ≤ 15 | Ca1 | Cb1 | Cc1 |
| 15 < Δt ≤ 25 | Ca2 | Cb2 | Cc2 |
| 25 < Δt | Ca3 | Cb3 | Cc3 |

METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2020-160828, filed on Sep. 25, 2020, in the Japanese Patent Office, the entire contents of which are hereby incorporated by reference.

BACKGROUND

1. Field

The present disclosure relates to a method of manufacturing a semiconductor device.

2. Related Art

As an apparatus of manufacturing a semiconductor device, a single wafer type apparatus configured to process a substrate one by one may be used. According to the single wafer type apparatus, for example, a film constituting a part of the semiconductor device may be formed by supplying a gas such as a process gas onto the substrate while heating the substrate.

When forming the same type of film on a plurality of substrates using a substrate processing apparatus such as the single wafer type apparatus, it is preferable that temperature conditions are the same for each substrate. For example, a temperature of each substrate is affected by components of the substrate processing apparatus such as a heater and a wall of a process chamber.

When processing the plurality of substrates using the substrate processing apparatus, a replacement operation may be performed to replace the substrate in the process chamber with another substrate. However, a processing environment may change before and after the replacement operation. For example, a temperature of the process chamber may be lowered. As a result, a quality of the film may vary among the plurality of substrates.

SUMMARY

Described herein is a technique capable of uniformizing a quality of a film among a plurality of substrates even when a processing environment among the plurality of substrates changes in a substrate processing apparatus configured to heat and process the plurality of substrates.

According to one aspect of the technique of the present disclosure, there is provided a method of manufacturing a semiconductor device, including: (a) loading a substrate into a process chamber; (b) supplying a gas to the substrate in the process chamber through a dispersion plate of a shower head provided upstream of the process chamber while heating the dispersion plate by a shower head heater and exhausting the gas from the process chamber; (c) unloading the substrate out of the process chamber; (d) measuring a temperature of the shower head before loading a subsequent substrate to be processed into the process chamber; and (e) comparing the temperature of the shower head after (d) with a pre-set temperature, and operating the shower head heater so as to control the temperature of the shower head to become close to the pre-set temperature when a difference between the temperature of the shower head and the pre-set temperature is greater than a predetermined value.

BRIEF DESCRIPTION OF THE DRAWINGS

FIG. 6 is a diagram schematically illustrating a first shower head temperature table included in the controller of the substrate processing apparatus according to the embodiments described herein.

FIG. 7 is a diagram schematically illustrating a second shower head temperature table included in the controller of the substrate processing apparatus according to the embodiments described herein.

FIG. 8 is a diagram schematically illustrating a control value table included in the controller of the substrate processing apparatus according to the embodiments described herein.

DETAILED DESCRIPTION

Embodiments

Figure 1:
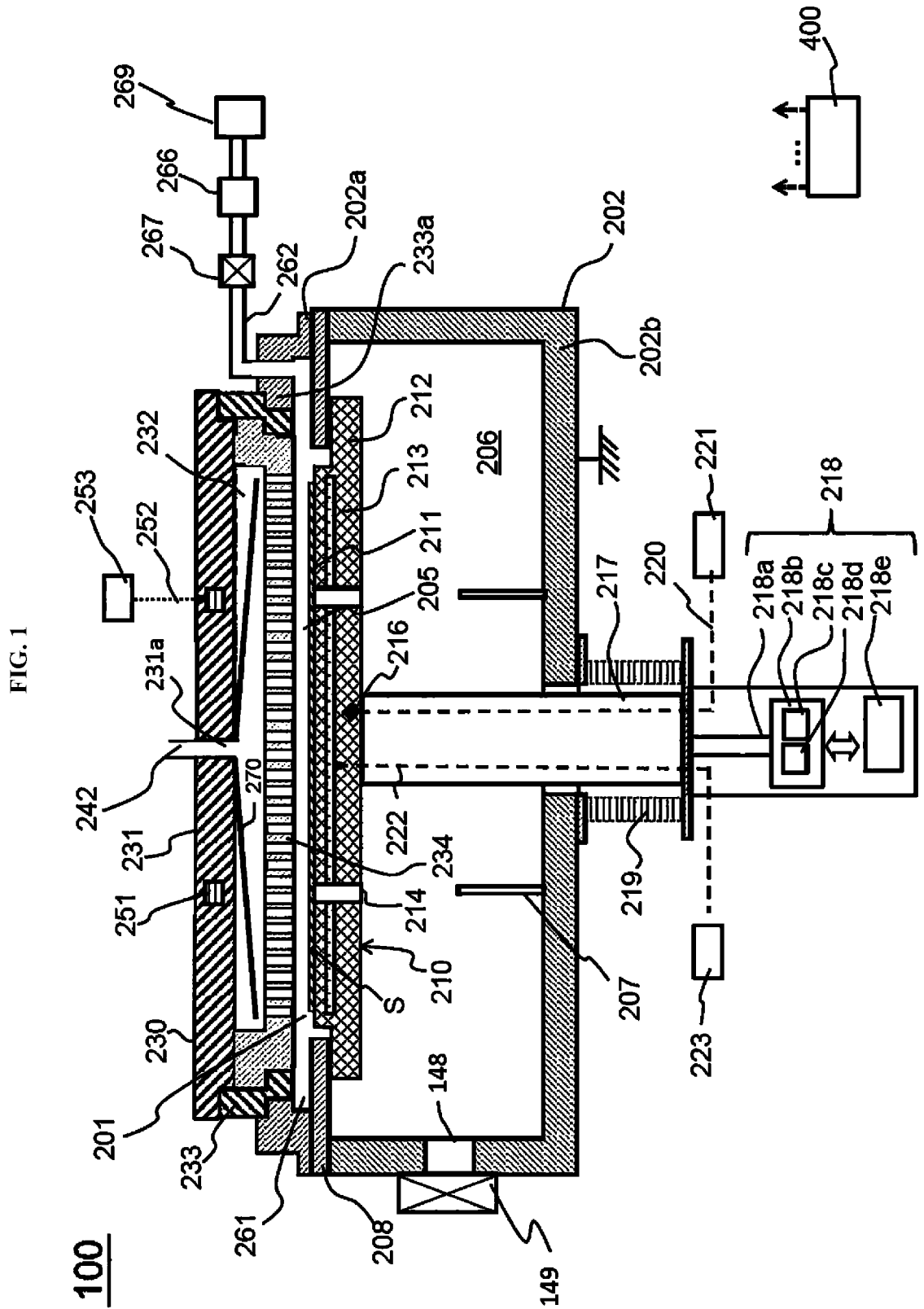
FIG. 1 is a diagram schematically illustrating an exemplary configuration of a substrate processing apparatus according to one or more embodiments described herein.

Hereinafter, one or more embodiments (also simply referred to as "embodiments") according to the technique of the present disclosure will be described with reference to the drawings. The drawings used in the following descriptions are all schematic. For example, a relationship between dimensions of each component and a ratio of each component shown in the drawings may not always match the actual ones. Further, even between the drawings, the relationship between the dimensions of each component and the ratio of each component may not always match.

First Embodiment

First, a first embodiment according to the technique of the present disclosure will be described.

FIG. 1 is a diagram schematically illustrating a substrate processing apparatus according to the present embodiment. Hereinafter, an exemplary configuration according to the present embodiment will be described in detail with reference to a substrate processing apparatus 100 shown in FIG. 1.

As shown in FIG. 1, the substrate processing apparatus 100 includes a vessel 202. For example, the vessel 202 includes a flat and sealed vessel whose horizontal cross-section is circular. The vessel 202 is made of a metal material such as aluminum (Al) and stainless steel (SUS). A process space 205 in which a substrate S such as a silicon wafer is processed and a transfer space 206 through which the substrate S is transferred into or out of the process space 205 are provided in the vessel 202. The vessel 202 is constituted by an upper vessel 202a and a lower vessel 202b. A partition plate 208 is provided between the upper vessel 202a and the lower vessel 202b. A structure constituting the process space 205 is referred to as a process chamber 201. According to the present embodiment, the process chamber 201 is constituted mainly by a dispersion plate 234 and a substrate mounting table 212, which will be described later.

A substrate loading/unloading port 148 is provided adjacent to a gate valve 149 at a side surface of the lower vessel 202b. The substrate S is transferred between the transfer space 206 and a vacuum transfer chamber (not shown) through the substrate loading/unloading port 148. Lift pins 207 are provided at a bottom of the lower vessel 202b. In addition, the lower vessel 202b is electrically grounded.

A substrate support 210 configured to support the substrate S is provided in the process space 205. The substrate support 210 mainly includes: the substrate mounting table 212 provided with a substrate placing surface 211 on which the substrate S is placed; and a heater 213 serving as a heating source provided in the substrate mounting table 212. The heater 213 may also be referred to as a substrate mounting table heater. Through-holes 214 through which the lift pins 207 penetrate are provided at positions of the substrate mounting table 212 corresponding to the lift pins 207.

A temperature measuring structure 216 serving as a first temperature measuring structure configured to measure a temperature of the heater 213 is provided in the substrate mounting table 212. The temperature measuring structure 216 is connected to a temperature meter 221 serving as a first temperature meter via a wiring 220.

A wiring 222 configured to supply the electric power is connected to the heater 213. The heater 213 is connected to a heater controller 223 via the wiring 222.

The temperature meter 221 and the heater controller 223 are electrically connected to a controller 400 described later. The controller 400 is configured to transmit control information to the heater controller 223 based on temperature information measured by the temperature meter 221. The heater controller 223 is configured to control the heater 213 with reference to the control information received from the controller 400.

The substrate mounting table 212 is supported by a shaft 217. The shaft 217 penetrates the bottom of the vessel 202, and is connected to an elevator 218 at the outside of the vessel 202.

The elevator 218 mainly includes: a support shaft 218a configured to support the shaft 217; and an actuator 218b configured to elevate or rotate the support shaft 218a. For example, the actuator 218b may include: an elevator 218c such as a motor configured to elevate and lower the support shaft 218a; and a rotator 218d such as a gear configured to rotate the support shaft 218a.

The elevator 218 may further include an instruction controller 218e serving as a part of the elevator 218 and configured to control the actuator 218b to move the support shaft 218a up and down or to rotate the support shaft 218a. The instruction controller 218e is electrically connected to the controller 400. The actuator 218b may be controlled by the instruction controller 218e based on an instruction from the controller 400.

The substrate S placed on the substrate placing surface 211 of the substrate mounting table 212 may be elevated or lowered by operating the elevator 218 by elevating or lowering the shaft 217 and the substrate mounting table 212. A bellows 219 covers a periphery of a lower end of the shaft 217 to maintain the process space 205 airtight.

When the substrate S is transferred, the substrate mounting table 212 is lowered until the substrate placing surface 211 faces the substrate loading/unloading port 148, that is, until a transfer position of the substrate S is reached. When the substrate S is processed, the substrate mounting table 212 is elevated until the substrate S reaches a processing position (also referred to as a substrate processing position) in the process space 205 as shown FIG. 1.

A shower head (also simply referred to as an "SH") 230 serving as a gas dispersion structure is provided in an upper portion (upstream side) of the process space 205. A lid 231 of the shower head 230 is provided with a through-hole 231a. The through-hole 231a is configured to communicate with a common gas supply pipe 242 described later. A buffer space 232 is provided in the shower head 230.

A gas guide 270 is provided in the buffer space 232. The gas guide 270 is of a conic shape around a gas introduction port 241. A diameter of the gas guide 270 increases along a radial direction of the substrate S. The gas guide 270 is configured such that a lower end of an edge of the gas guide 270 is located outside an edge (end) of the substrate S. The gas guide 270 is configured to efficiently guide a gas such as a process gas supplied thereto in a direction of the dispersion plate 234 described later. The gas guide 270 will be described later in detail.

An electrode 251 is provided at the shower head 230. The electrode 251 is made of a metal material. The electrode 251 is configured such that a thermal conductivity of the electrode 251 is higher than that of the dispersion plate 234. The electrode 251 is of a circumferential shape around the through-hole 231a.

A plasma controller 253 is connected to the electrode 251 via a wiring 252. According to an instruction from the plasma controller 253, a cleaning gas plasma (that is, a cleaning gas in a plasma state) described later is generated in the process space 205 in the shower head 230.

The upper vessel 202a includes a flange (not shown). A support block 233 is placed on and fixed to the flange. The support block 233 includes a flange 233a. The dispersion plate 234 is placed on and fixed to the flange 233a. The lid 231 is fixed to an upper surface of the support block 233.

Figure 2:
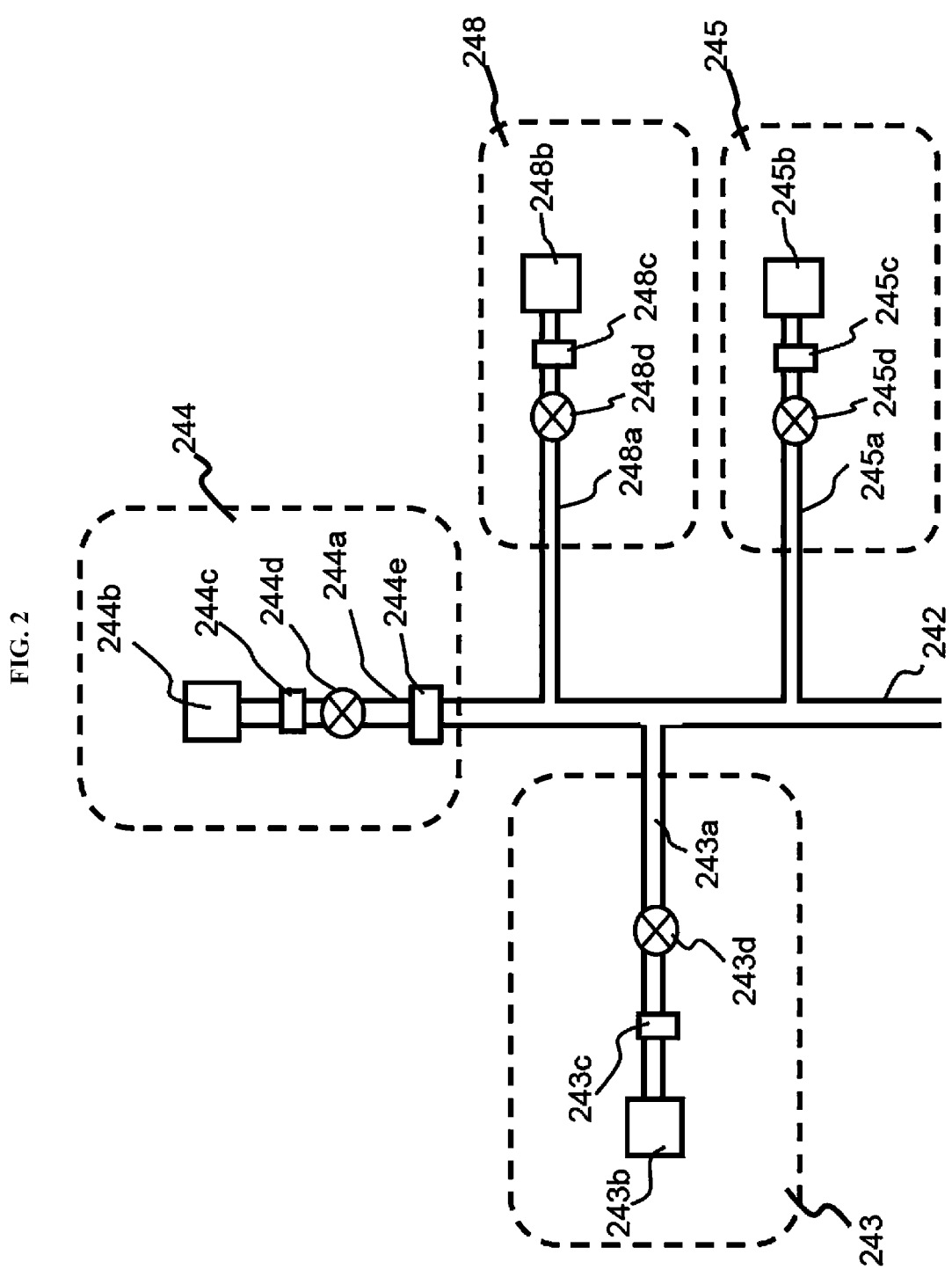
FIG. 2 is a diagram schematically illustrating an exemplary configuration of a gas supplier of the substrate processing apparatus according to the embodiments described herein.

Subsequently, a gas supplier (which is a gas supply structure or a gas supply system) will be described with reference to FIG. 2. A first gas supply pipe 243a, a second gas supply pipe 244a, a third gas supply pipe 245a and a fourth gas supply pipe 248a are connected to the common gas supply pipe 242.

A first gas supply source 243b, a mass flow controller (also simply referred to as an "MFC") 243c serving as a flow rate controller (flow rate control structure) and a valve 243d serving as an opening/closing valve are sequentially provided in order at the first gas supply pipe 243a from an upstream side toward a downstream side of the first gas supply pipe 243a.

The first gas supply source 243b is a source of a first gas (also referred to as a "first element-containing gas") containing a first element. The first element-containing gas serves as a source gas, which is one of process gases.

According to the present embodiment, for example, the first element includes silicon (Si). That is, for example, the first element-containing gas includes a silicon-containing gas. The present embodiment will be described in detail by way of an example in which hexachlorodisilane ($Si_2C_6$, also referred to as HCDS) gas is used as the silicon-containing gas.

For example, a first gas supplier (also referred to as a silicon-containing gas supplier) 243 is constituted mainly by the first gas supply pipe 243a, the mass flow controller 243c and the valve 243d.

A second gas supply source 244b, a mass flow controller (MFC) 244c serving as a flow rate controller (flow rate control structure) and a valve 244d serving as an opening/closing valve are sequentially provided in order at the second gas supply pipe 244a from an upstream side toward a downstream side of the second gas supply pipe 244a.

The second gas supply source 244b is a source of a second gas (also referred to as a "second element-containing gas") containing a second element. The second element-containing gas is one of the process gases. The second element-containing gas may serve as a reactive gas or a modifying gas.

According to the present embodiment, the second element-containing gas contains the second element different from the first element. For example, the second element includes one of oxygen (O), nitrogen (N) and carbon (C). According to the present embodiment, for example, the second element-containing gas includes a nitrogen-containing gas. The present embodiment will be described in detail by way of an example in which ammonia ($NH_3$) gas is used as the nitrogen-containing gas.

When the substrate S is processed with the second gas in a plasma state, a plasma generator (also referred to as a "remote plasma unit") 244e may be provided in the second gas supply pipe 244a.

A second gas supplier (also referred to as a "reactive gas supplier") 244 is constituted mainly by the second gas supply pipe 244a, the mass flow controller 244c and the valve 244d. The second gas supplier 244 may further include the plasma generator 244e.

A third gas supply source 245b, a mass flow controller (MFC) 245c serving as a flow rate controller (flow rate control structure) and a valve 245d serving as an opening/closing valve are sequentially provided in order at the third gas supply pipe 245a from an upstream side toward a downstream side of the third gas supply pipe 245a.

The third gas supply source 245b is a source of an inert gas. According to the present embodiment, for example, $N_2$ gas may be used as the inert gas.

A third gas supplier 245 is constituted mainly by the third gas supply pipe 245a, the mass flow controller 245c and the valve 245d.

The inert gas supplied from the third gas supply source 245b serves as a purge gas for purging the gas remaining in the vessel 202 or the shower head 230 in a substrate processing described later.

A fourth gas supply source 248b, a mass flow controller (MFC) 248c serving as a flow rate controller (flow rate control structure) and a valve 248d serving as an opening/closing valve are sequentially provided in order at the fourth gas supply pipe 248a from an upstream side toward a downstream side of the fourth gas supply pipe 248a.

The fourth gas supply source 248b is a source of a cleaning gas. According to the present embodiment, for example, $NF_3$ gas or $F_2$ gas may be used as the cleaning gas.

A fourth gas supplier 248 is constituted mainly by the fourth gas supply pipe 248a, the mass flow controller 248c and the valve 248d.

The cleaning gas supplied from the fourth gas supply source 248b is converted into a plasma state when cleaning the process chamber 201 or the shower head 230. It is possible to remove by-products remaining in the vessel 202 or the shower head 230 by supplying the cleaning gas in the plasma state.

An exhaust pipe 262 communicates with the process space 205 via an exhaust buffer structure 261. The exhaust buffer structure 261 is of a circumferential shape so as to surround an outer periphery of the substrate S. According to the present embodiment, the exhaust buffer structure 261 is provided between the partition plate 208 and the upper vessel 202a.

The exhaust pipe 262 is connected to the upper vessel 202a on an upper side of the exhaust buffer structure 261 such that the exhaust pipe 262 communicates with the process space 205 via the exhaust buffer structure 261. An APC (Automatic Pressure Controller) 266 is provided at the exhaust pipe 262. The APC 266 serves as a pressure controller capable of controlling an inner pressure of the process space 205 to a predetermined pressure. The APC 266 includes a valve body (not shown) whose opening degree can be adjusted. The APC 266 is configured to adjust a conductance of the exhaust pipe 262 in accordance with an instruction from the controller 400.

A valve 267 is provided at the exhaust pipe 262 on an upstream side of the APC 266. The exhaust pipe 262, the valve 267 and the APC 266 may be collectively referred to as an exhauster (also referred to as an "exhaust system"). Further, a dry pump (DP) 269 is provided at a downstream side of the exhaust pipe 262. The dry pump (also referred to as an "exhaust pump") 269 is configured to exhaust an inner atmosphere of the process space 205 via the exhaust pipe 262.

The gas supplied to the process space 205 via the dispersion plate 234 flows toward the exhaust buffer structure 261 after contacting the substrate S, and is exhausted through the exhaust pipe 262. In a flow of the gas flow described above, a pressure of a portion below a center of the dispersion plate 234 is higher than a pressure of a portion below an edge of the dispersion plate 234. This is because: the gas in the portion below the center of the dispersion plate 234 may stagnate since it is difficult for the gas in the portion below the center of the dispersion plate 234 to flow into the exhaust buffer structure 261; and the gas in the portion below the edge of the dispersion plate 234 may easily flow into the exhaust buffer structure 261 due to an influence of the dry pump 269. Since the gas stagnates in the portion below the center of the dispersion plate 234 as described above, the gas may be easily heated and a temperature of the gas in the portion below the center of the dispersion plate 234 may be elevated. When compared, the temperature of the gas in the portion below the edge of the dispersion plate 234 is lower than the temperature of the gas in the portion below the center of the dispersion plate 234. That is, a temperature of the edge of the dispersion plate 234 is lower than a temperature of the center of the dispersion plate 234.

Subsequently, a structure of the gas guide 270 will be described in detail with reference to FIGS. 3 and 4. A shower head heater 271 is provided in the gas guide 270. The shower head heater 271 is configured to be capable of heating at least one among the gas guide 270, an inner atmosphere of the buffer space 232, the dispersion plate 234 and the lid 231. The shower head heater 271 may also be referred to as a "shower head heating structure" or a "gas guide heating structure".

Figure 3:
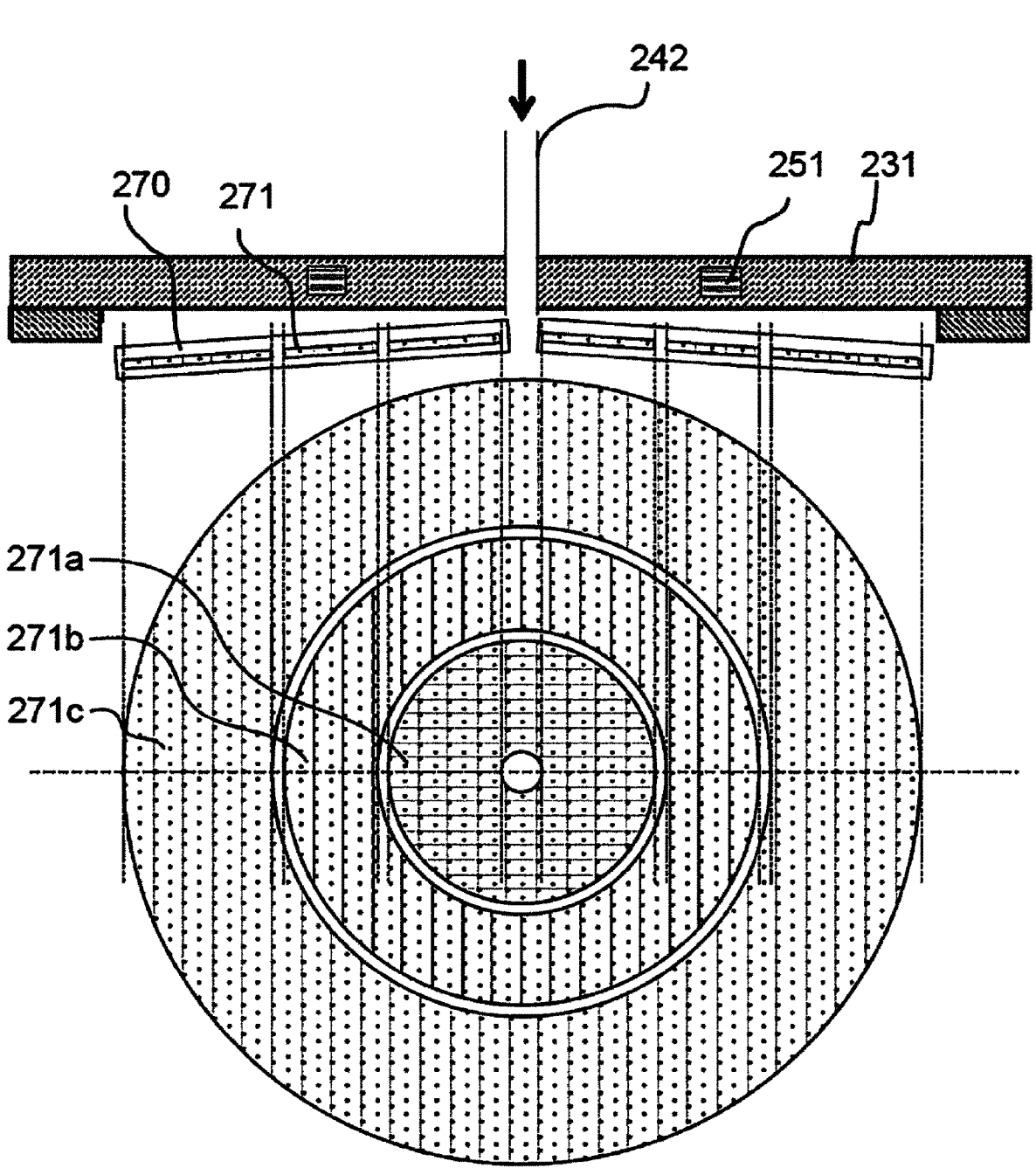
FIG. 3 is a diagram schematically illustrating an exemplary configuration of a shower head heater of the substrate processing apparatus according to the embodiments described herein.
Figure 4:
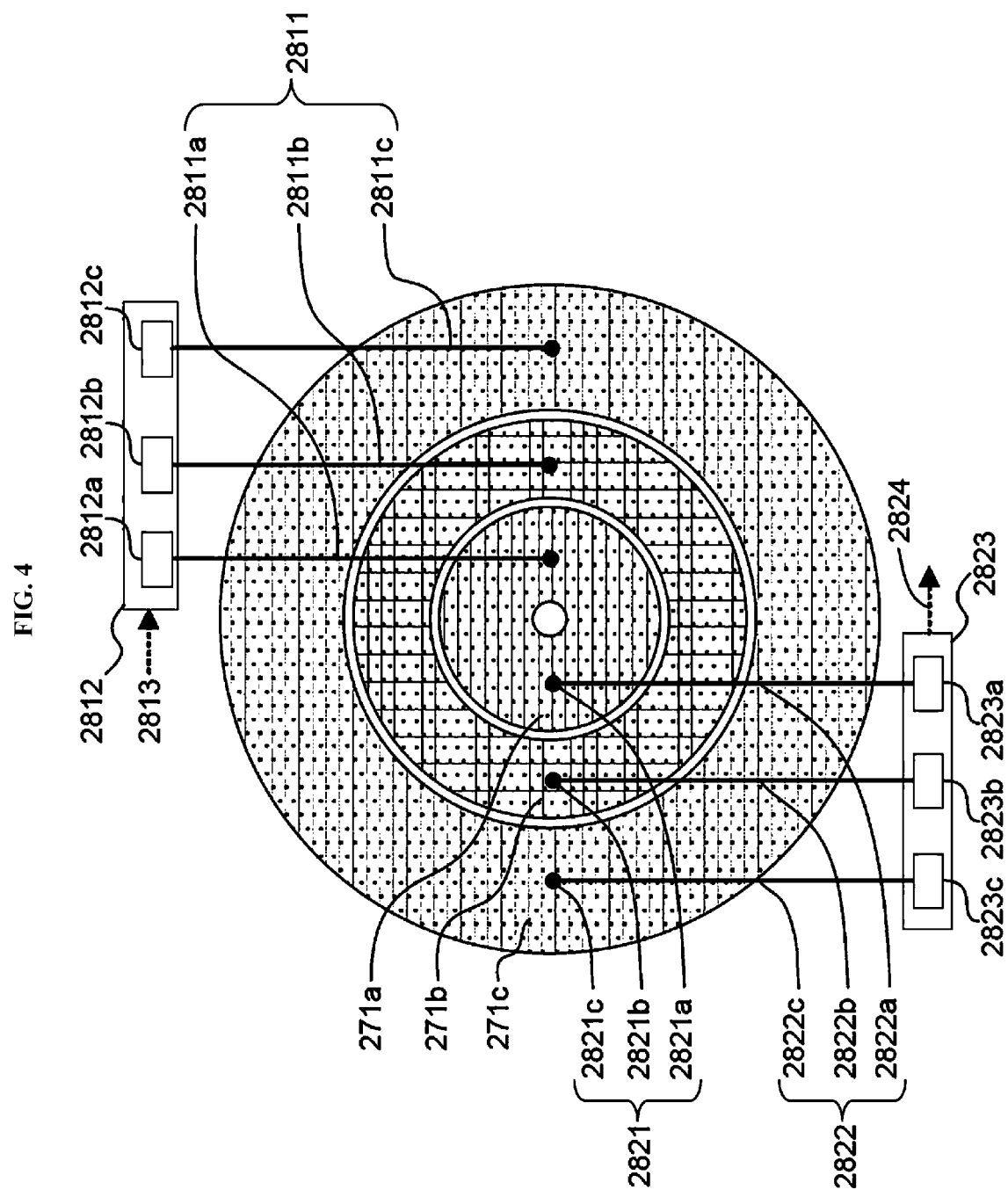
FIG. 4 is a diagram schematically illustrating the shower head heater and components around the shower head heater of the substrate processing apparatus according to the embodiments described herein.

As shown in FIG. 3, the shower head heater 271 is divided into a plurality of zones (portions). That is, the shower head heater 271 is configured to be capable of heating each zone (that is, for example, a central portion (which is a central zone) 271*a*, an intermediate portion (which is an intermediate zone) 271*b* and an edge portion (which is an edge zone) 271*c*.

A lower portion of FIG. 3 schematically illustrates the shower head heater 271 provided on the gas guide 270 when viewed from the substrate S. As shown in FIG. 3, the shower head heater 271 is constituted by the plurality of zones. One of the plurality of zones, for example, the intermediate portion 271*b* is configured to be located below the electrode 251. With such a configuration, even when a temperature is locally different in a portion below the electrode 251, it is possible to uniformly control a temperature of a surface of the dispersion plate 234 (that is, a surface of the dispersion plate 234 facing the substrate S).

Subsequently, components around the shower head heater 271 will be described with reference to FIG. 4. A power supply line 2811 is connected to the shower head heater 271 for each zone such that a temperature of the shower head heater 271 can be controlled for each zone. The power supply line 2811 is connected to a power supply controller 2812 configured to supply the electric power to the shower head heater 271.

Specifically, a power supply line 2811*a* is connected to the central portion 271*a*, a power supply line 2811*b* is connected to the intermediate portion 271*b*, and a power supply line 2811*c* is connected to the edge portion 271*c*. Further, the power supply line 2811*a* is connected to a power supply controller 2812*a*, the power supply line 2811*b* is connected to a power supply controller 2812*b*, and the power supply line 2811*c* is connected to a power supply controller 2812*c*.

The power supply controller 2812 (that is, the power supply controller 2812*a*, the power supply controller 2812*b* and the power supply controller 2812*c*) serving as a temperature controller is electrically connected to the controller 400 via a wiring 2813. The controller 400 is configured to transmit a power value (which is a preset temperature data) for controlling the shower head heater 271 to the power supply controller 2812. After receiving the power value, the power supply controller 2812 supplies the electric power based on the information (that is, the power value) to the shower head heater 271 (that is, the central portion 271*a*, the intermediate portion 271*b* and the edge portion 271*c*) so as to control the temperature of the shower head heater 271.

A temperature detector 2821 corresponding to each zone (portion) of the shower head heater 271 is provided in the vicinity of the shower head heater 271. The temperature detector 2821 is connected to a temperature meter 2823 via a wiring 2822, and the temperature meter 2823 capable of detecting the temperature for each zone is connected to the controller 400 via a wiring 2824.

Specifically, a temperature detector 2821*a* is provided in the vicinity of the central portion 271*a*. The temperature detector 2821*a* is connected to a temperature meter 2823*a* via a wiring 2822*a*. A temperature detector 2821*b* is provided in the vicinity of the intermediate portion 271*b*. The temperature detector 2821*b* is connected to a temperature meter 2823*b* via a wiring 2822*b*. A temperature detector 2821*c* is provided in the vicinity of the edge portion 271*c*. The temperature detector 2821*c* is connected to a temperature meter 2823*c* via a wiring 2822*c*.

The substrate processing apparatus 100 includes the controller 400 configured to control operations of components constituting the substrate processing apparatus 100.

Figure 5:
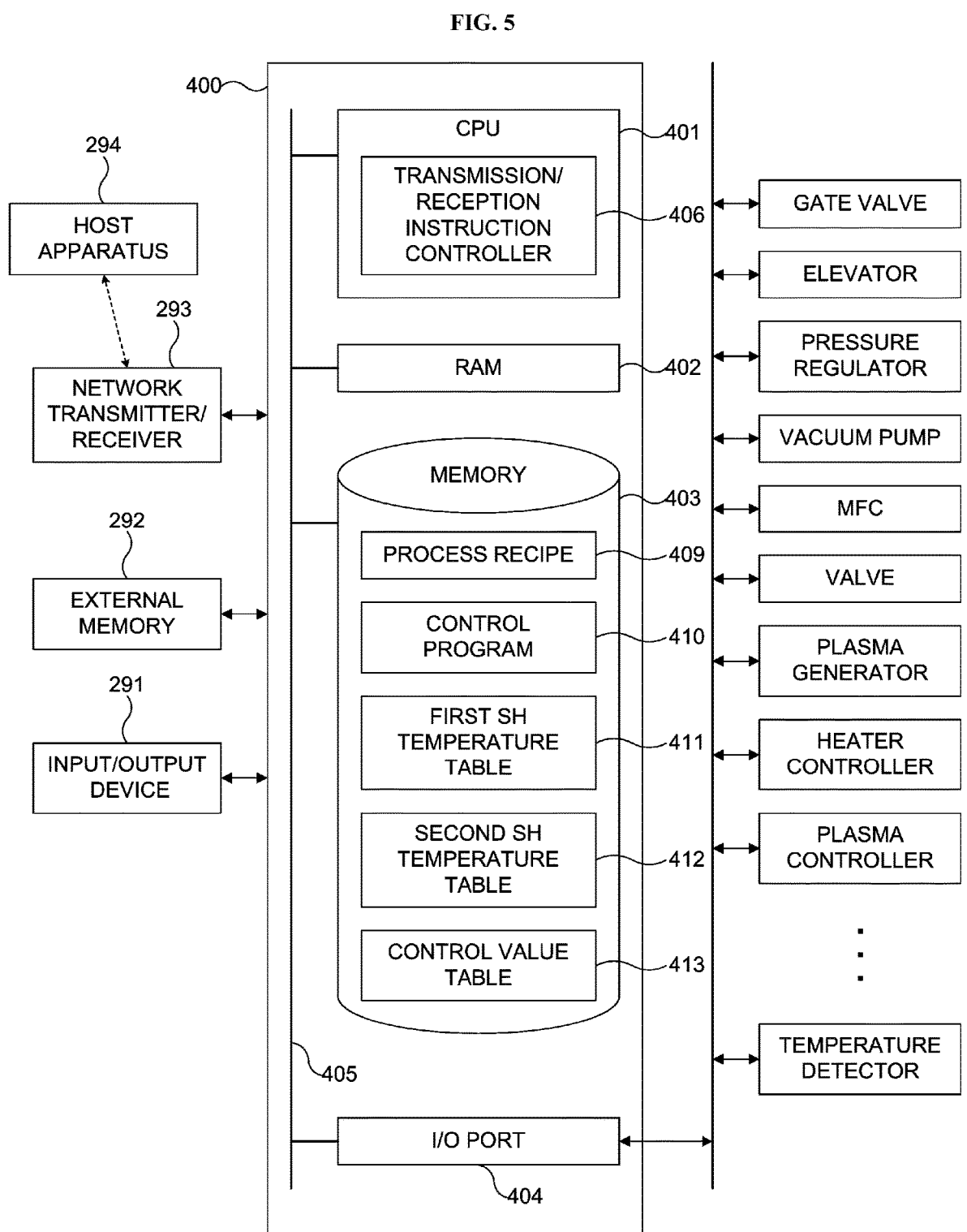
FIG. 5 is a diagram schematically illustrating a controller of the substrate processing apparatus according to the embodiments described herein.

FIG. 5 is a diagram schematically illustrating a configuration of the controller 400. The controller 400, which is a control apparatus (control structure) may be embodied by a computer including a CPU (Central Processing Unit) 401, a RAM (Random Access Memory) 402, a memory 403 serving as a storage and an I/O port (input/output port) 404. The RAM 402, the memory 403 and the I/O port 404 may exchange data with the CPU 401 via an internal bus 405. The transmission/reception of the data in the substrate processing apparatus 100 may be performed by an instruction from a transmission/reception instruction controller 406, which is also one of functions of the CPU 401.

A network transmitter/receiver 293 connected to a host apparatus 294 via a network is provided. For example, the network transmitter/receiver 293 is capable of receiving information regarding a processing history and a processing schedule of the substrate S in a specific lot.

The memory 403 may be embodied by a component such as a flash memory and a HDD (Hard Disk Drive). For example, a process recipe 409 in which information such as the sequences and the conditions of the substrate processing described later is stored and a control program 410 for controlling the operation of the substrate processing apparatus 100 may be readably stored in the memory 403. Further, a first shower head temperature table 411, a second shower head temperature table 412 and a control value table 413, which will be described later, may be readably and writably stored in the memory 403.

The process recipe 409 is a program that is executed by the controller 400 to obtain a predetermined result by performing the sequences of the substrate processing described later. Hereinafter, the process recipe 409 and the control program 410 may be collectively or individually referred to simply as a "program." In the present specification, the term "program" may refer to the process recipe 409 alone, may refer to the control program 410 alone, or may refer to both of the process recipe 409 and the control program 410. The RAM 402 serves as a memory area (work area) in which the program or the data read by the CPU 401 are temporarily stored.

The I/O port 404 is electrically connected to the components of the substrate processing apparatus 100 described above such as the gate valve 149, the elevator 218, a pressure regulator such as the pressure controller (the APC 266), a vacuum pump such as the exhaust pump (dry pump) 269, the heater controller 223 and the plasma controller 253.

The CPU 401 is configured to read and execute the control program 410 from the memory 403 and read the process recipe 409 in accordance with an instruction such as an operation command inputted from an input/output device 291. The CPU 401 is configured to control various operations in accordance with the process recipe 409 such as an opening and closing operation of the gate valve 149, an elevating and lowering operation of the elevator 218, an operation of the temperature meter 221, an operation of the heater controller 223, an operation of the plasma controller 253, an ON/OFF control operation of the vacuum pump, a flow rate adjusting operation of each MFC described above and an operation of each valve described above.

For example, the controller 400 according to the present embodiment may be embodied by preparing an external memory 292 (for example, a magnetic disk such as a hard disk, an optical disk such as a DVD, a magneto-optical disk such as an MO, a semiconductor memory such as a USB memory) storing the program described above and installing the program onto a computer using the external memory 292. The method of providing the program to the computer is not limited to the external memory 292. For example, the program may be directly provided to the computer by a communication means such as the Internet and a dedicated line instead of the external memory 292. The memory 403 and the external memory 292 may be embodied by a non-transitory computer-readable recording medium. Hereinafter, the memory 403 and the external memory 292 may be collectively or individually referred to as a recording medium. In the present specification, the term "recording medium" may refer to the memory 403 alone, may refer to the external memory 292 alone, or may refer to both of the memory 403 and the external memory 292.

Subsequently, the first shower head temperature table 411 will be described with reference to FIG. 6. A vertical axis shown in FIG. 6 indicates a lot serial number, and a horizontal axis shown in FIG. 6 indicates a shower head temperature (also referred to as a "SH temperature") corresponding to a substrate serial number. A temperature of the shower head detected by the temperature meter 2823 is recorded in the first shower head temperature table 411. According to the present embodiment, for example, among the data detected by the temperature meters 2823a, 2823b and 2823c of the temperature meter 2823, the data detected by the temperature meter 2823b is recorded in the first shower head temperature table 411.

In the present embodiment, for example, "m", which is a natural number equal to or greater than 3, indicates the number of substrates processed in a lot whose lot serial number is "1". Further, as shown in FIG. 6, the number of lots is greater than n+1, where n is a natural number. The number of substrates in each lot may be different for each lot. For example, the number of substrates in an $n^{th}$ lot (for example, a lot whose lot serial number is "n") may be "m−2" while the number of substrates in a first lot (for example, a lot whose lot serial number is "1") may be "m".

A temperature of the shower head 230 measured in a first temperature measuring step S104, which will be described later, is recorded in the first shower head temperature table 411. In the first temperature measuring step S104, for example, the temperature of the shower head 230 is measured in the final substrate processing performed in a current lot. In other words, the temperature of the shower head 230 is measured in the substrate processing before a subsequent lot processing setting step S108 is performed, which will be described later. When the current lot is the first lot, the temperature of the shower head 230 is measured in the $m^{th}$ substrate processing of the first lot. When the current lot is the $n^{th}$ lot, the temperature of the shower head 230 is measured in the $(m−2)^{th}$ substrate processing of the $n^{th}$ lot.

Subsequently, the second shower head temperature table 412 will be described with reference to FIG. 7. The information of the lot serial number processed immediately before the current lot and the corresponding SH temperature information are recorded in the second shower head temperature table 412. The "SH temperature information" in the second shower head temperature table 412 indicates the SH temperature measured in a second temperature measuring step S114, which will be described later. That is, the temperature of the shower head 230 detected by the temperature meter 2823 is recorded in the second shower head temperature table 412 as the SH temperature information.

Subsequently, the control value table 413 of the shower head heater 271 will be described with reference to FIG. 8. In the control value table 413, a control value of the shower head heater 271 corresponding to Δt, which will be described later, is recorded. Values Ca0, Ca1, Ca2 and Ca3 indicate the control values of the central portion 271a, values Cb0, Cb1, Cb2 and Cb3 indicate the control values of the intermediate portion 271b, and values Cc0, Cc1, Cc2 and Cc3 indicate the control values of the edge portion 271c. The values Ca0, Cb0 and Cc0 are initial values of the control values. As the control value of each portion of the shower head heater 271 approaches Ca3, Cb3 and Cc3, the shower head heater 271 is controlled at a higher temperature.

Hereinafter, as a part of a process of manufacturing a semiconductor device, the substrate processing will be described by way of an example in which a film-forming process of forming a film on the substrate S is performed by using the substrate processing apparatus 100 described above. In the following description, the controller 400 controls the operations of the components constituting the substrate processing apparatus 100.

Figure 9:
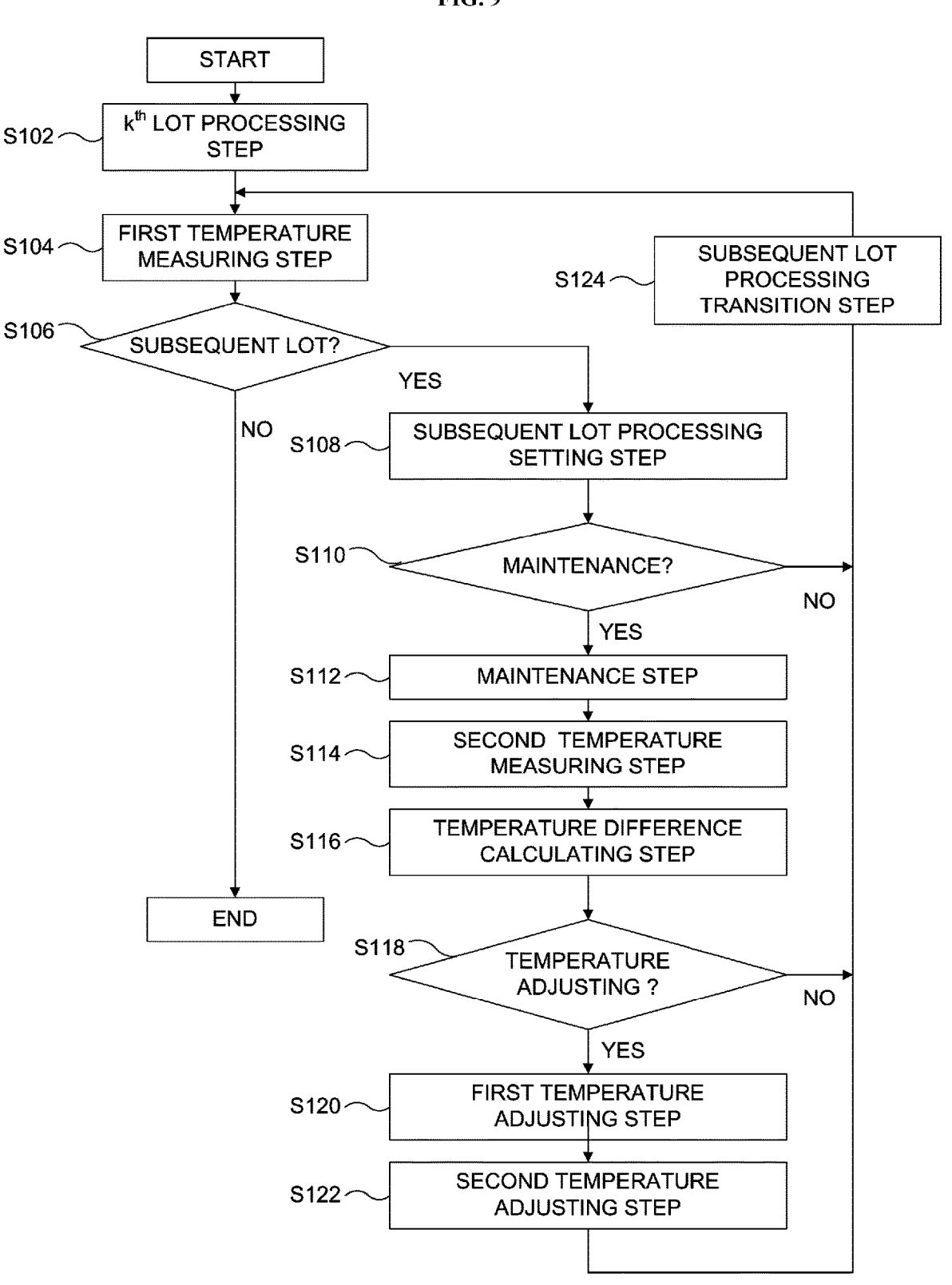
FIG. 9 is a flow chart schematically illustrating a substrate processing according to the embodiments described herein.

First, the substrate processing performed on a lot basis will be described with reference to FIG. 9.

<$k^{th}$ Lot Processing Step S102>

A $k^{th}$ lot processing step S102 will be described. According to the present embodiment, k is a variable, and is a natural number equal to or greater than 1.

In the $k^{th}$ lot processing step S102, substrates of the $k^{th}$ lot including the substrate S are processed. In the $k^{th}$ lot processing step S102, the film-forming process is repeatedly performed for each of the substrates of the $k^{th}$ lot in the process space 205. During the film-forming process, the shower head heater 271 is heated to a desired temperature so that a surface of the dispersion plate 234, specifically, a surface of the dispersion plate 234 facing the substrate S placed on the substrate placing surface 211 is uniformly heated.

The shower head heater 271 heats the dispersion plate 234 as follows. As described above, the temperature of the edge of the dispersion plate 234 tends to be lowered as compared with the temperature of the center of the dispersion plate 234. In addition, since the gas stagnates in the portion below the center of the dispersion plate 234 as described above, the center of the dispersion plate 234 may be heated to a higher temperature due to the gas in the portion below the center of the dispersion plate 234.

Under such circumstances, the shower head heater 271 is controlled so that the temperature of the edge portion 271c in the $k^{th}$ lot processing step S102 (that is, in the film-forming process) is higher than that of the central portion 271a in the $k^{th}$ lot processing step S102 so as to uniformly heat the dispersion plate 234. By controlling the shower head heater 271 as described above, it is possible to compensate for a temperature drop on the edge of the dispersion plate 234, and it is also possible to uniformly heat the dispersion plate 234.

Each zone (portion) is controlled by the initial values Ca0, Cb0 and Cc0 of the control value table 413.

When the film-forming process for a certain substrate of the $k^{th}$ lot is completed, the processed substrate is unloaded out of the substrate processing apparatus 100 in order to load the next substrate to be processed into the substrate processing apparatus 100. Then, the unprocessed substrate (that is, the next substrate) is loaded into the substrate processing apparatus 100. The film-forming process will be described in detail later.

<First Temperature Measuring Step S104>

Subsequently, the first temperature measuring step S104 will be described. In the first temperature measuring step S104, the temperature detector 2821 measures the temperature of the shower head 230 in the $k^{th}$ lot processing step S102. Specifically, a temperature of the dispersion plate 234 is measured. The temperature meter 2823 records the temperature measured by the temperature detector 2821 in the first shower head temperature table 411 as reference data. In the first temperature measuring step S104, for example, the temperature detector 2821*b* measures the temperature, and the temperature meter 2823*b* records the temperature measured by the temperature detector 2821*b* in the first shower head temperature table 411.

Subsequently, the timing for detecting the temperature will be described. As described above, in the $k^{th}$ lot processing step S102, the substrates including the substrate S are processed. For example, the first temperature measuring step S104 is performed immediately after the final substrate processing (that is, the final film-forming process) of the $k^{th}$ lot. When the $k^{th}$ lot is the first lot, the temperature of the shower head 230 is measured immediately after the $m^{th}$ substrate processing of the first lot. When the $k^{th}$ lot is the $n^{th}$ lot, the temperature of the shower head 230 is measured immediately after the $(m-2)^{th}$ substrate processing of the $n^{th}$ lot. By detecting the temperature of the shower head 230 at such a timing, the temperature of the shower head 230 can be detected stably. For example, the first temperature measuring step S104 may be performed in parallel with the final substrate processing of the $k^{th}$ lot.

<Determination Step S106>

Subsequently, a determination step S106 will be described. When the $k^{th}$ lot processing step S102 and the first temperature measuring step S104 are completed, the determination step S106 is performed. In the determination step S106, it is determined whether or not a predetermined number of lots are processed. That is, it is determined whether or not a subsequent lot exists. When it is determined that the predetermined number of lots are processed, the processing is terminated. When it is determined that the predetermined number of lots are not processed, the subsequent lot processing setting step S108 is performed.

<Subsequent Lot Processing Setting Step S108>

Subsequently, the subsequent lot processing setting step S108 will be described. In the subsequent lot processing setting step S108, the substrate processing apparatus 100 is set so as to correspond to the subsequent $(k+1)^{th}$ lot (that is, a lot to be processed next). For example, when the $n^{th}$ lot is processed, the substrate processing apparatus 100 is set so as to process an $(n+1)^{th}$ lot. For example, the substrate processing apparatus 100 is set such that a transfer robot (not shown) is switched to access a FOUP in which substrates of the $(n+1)^{th}$ lot are stored.

In the subsequent lot processing setting step S108, since the substrates of the $k^{th}$ lot are unloaded out of the substrate processing apparatus 100, the substrate mounting table 212 stands by at the transfer position. The subsequent lot processing setting step S108 may also be simply referred to as a setting step S108.

<Determination Step S110>

Subsequently, a determination step S110 will be described. In the determination step S110, it is determined whether to perform a maintenance operation (that is, a maintenance step S112) of the substrate processing apparatus 100. In the maintenance step S112, for example, deposits constituted by by-products attached to a wall of the process chamber 201 constituting the process space 205 and by-products attached to the dispersion plate 234 are removed. By removing the deposits, it is possible to process the substrates of the $(k+1)^{th}$ lot without being affected by the by-products.

Therefore, in the determination step S110, it is determined not to perform the maintenance step S112 ("NO" in FIG. 9) when the substrates of the $(k+1)^{th}$ lot are not affected by the by-products, and it is determined to perform the maintenance step S112 ("YES" in FIG. 9) when the substrates of the $(k+1)^{th}$ lot are affected by the by-products. As a quantitative standard for the influence of the by-products, for example, parameters such as the number of substrates processed in the substrate processing apparatus 100, an operation time of the substrate processing apparatus 100 and a time duration of supplying the gas may be used.

When it is determined to perform the maintenance step S112 ("YES" in FIG. 9) in the determination step S110, the maintenance step S112 is performed. When it is determined not to perform the maintenance step S112 ("NO" in FIG. 9) in the determination step S110, a subsequent lot processing transition step S124 is performed.

<Maintenance Step S112>

When it is determined to perform the maintenance step S112 ("YES" in FIG. 9) in the determination step S110, the maintenance step S112 is performed. In the maintenance step S112, for example, the deposits are removed by performing an etching process such as a dry etching process.

After the maintenance step S112, the temperature of the shower head 230 may be lowered so as to stop the operation of the heater 213 or to remove the deposits by using a material such as a low temperature liquid and a low temperature gas.

When the temperature of the shower head 230 is lowered in the maintenance step S112, a processing environment may change between the processing of the current lot (that is, the $k^{th}$ lot) and the processing of the subsequent lot (that is, the $(k+1)^{th}$ lot). Therefore, according to the present embodiment, the second temperature measuring step S114 is performed after the maintenance step S112.

<Second Temperature Measuring Step S114>

Subsequently, the second temperature measuring step S114 will be described. The second temperature measuring step S114 is performed after the subsequent lot processing setting step S108. For example, the second temperature measuring step S114 may be performed after the maintenance step S112 is performed. Specifically, in the second temperature measuring step S114, the temperature of the shower head 230 immediately before loading the substrate of the subsequent lot is measured. In the second temperature measuring step S114, the temperature detector 2821 measures the temperature of the dispersion plate 234 serving as a part of the shower head 230. Then, the temperature meter 2823 records the temperature measured by the temperature detector 2821 in the second shower head temperature table 412. In the second temperature measuring step S114, the temperature detector 2821 and the temperature meter 2823 used in the first temperature measuring step S104 are used so that the detection conditions in the second temperature measuring step S114 are substantially the same as those in the first temperature measuring step S104. For example, the temperature detector 2821*b* detects the temperature of the dispersion plate 234, and the temperature meter 2823*b* records the temperature measured by the temperature detector 2821*b* in the second shower head temperature table 412.

The temperature drop of the dispersion plate 234 may vary between lots, for example, when a timing of performing the subsequent lot processing setting step S108 is different or when the temperature in the $k^{th}$ lot varies for each film-forming process.

<Temperature Difference Calculating Step S116>

Subsequently, a temperature difference calculating step S116 will be described. In the present embodiment, the term "temperature difference" is represented by $\Delta t$ shown in FIG. 8, and refers to a temperature difference between the temperature measured in the first temperature measuring step S104 and the temperature measured in the second temperature measuring step S114.

For example, a temperature difference between the temperature at the lot serial number k (that is, the $k^{th}$ lot) as shown in the first shower head temperature table 411 and the temperature at the lot serial number k processed immediately before the current lot as shown in the second shower head temperature table 412 may be calculated.

<Determination Step S118>

Subsequently, a determination step S118 will be described. When the temperature of the shower head 230 is lowered as described above, the reproducibility of the substrate processing state may be deteriorated. For example, the temperature of the shower head 230 may be different between the substrate processed at the end of the $k^{th}$ lot and the substrate processed at the start of the $(k+1)^{th}$ lot.

Since the shower head 230 is arranged in the vicinity of the substrate S, the temperature of the shower head 230 affects a temperature of the substrate S. In particular, since the dispersion plate 234 faces a surface of the substrate S, when the temperature of the dispersion plate 234 is lowered, the substrate processing may be affected. When the temperature of the dispersion plate 234 is partially lowered, a uniformity of the substrate processing on the surface of the substrate S may be affected.

In particular, since the edge of the dispersion plate 234 is provided close to the exhaust buffer structure 261, the heat may be easily released through the exhaust buffer structure 261. Therefore, the temperature of the edge of the dispersion plate 234 is lower than that of the center of the dispersion plate 234.

Due to such an influence, when the temperature of the shower head 230 is different, a quality of the film formed on the substrate S may vary. Therefore, according to the present embodiment, a first temperature adjusting step S120 described later may be performed. In the determination step S118, it is determined whether to perform the first temperature adjusting step S120.

In the determination step S118, it is determined whether to perform the first temperature adjusting step S120 using the control value table 413 shown in FIG. 8. For example, when $\Delta t$ is equal to or less than 5° C., it is considered that the temperature variation does not affect the substrate processing, and it is determined not to perform the first temperature adjusting step S120. When it is determined not to perform the first temperature adjusting step S120, the subsequent lot processing transition step S124 is performed. For example, when $\Delta t$ is greater than 5° C., it is determined to perform the first temperature adjusting step S120, and then the first temperature adjusting step S120 is performed.

<First Temperature Adjusting Step S120>

Subsequently, the first temperature adjusting step S120 will be described. As described above, when switching to the subsequent lot, the temperature of the shower head 230 may be lowered. As a result, the processing environment of the substrates may change between the processing of the current lot and the processing of the subsequent lot. Therefore, in the first temperature adjusting step S120, the temperature of the shower head 230 for the subsequent lot is adjusted to the same temperature as that of the current lot. The first temperature adjusting step S120 will be described in detail below.

As described above, when $\Delta t$ is higher than a predetermined temperature, the shower head 230 is heated according to $\Delta t$. The controller 400 controls the shower head heater 271 based on the control value read from the control value table 413 to heat the shower head 230 to the predetermined temperature.

When heating the shower head 230, the controller 400 controls the shower head heater 271 such that, according to $\Delta t$, a temperature of the portion below the center of the dispersion plate 234 becomes equal to a temperature adapted to the substrate processing and the temperature of the edge of the dispersion plate 234 is higher than that of the center of the dispersion plate 234, that is, higher than the temperature adapted to the substrate processing.

Subsequently, the first temperature adjusting step S120 according to the present embodiment will be further described. In the first temperature adjusting step S120, when $\Delta t$ is higher than the predetermined temperature, the shower head 230 is heated according to $\Delta t$. The controller 400 controls the shower head heater 271 based on the control value read from the control value table 413 to heat the temperature of the shower head 230 to the predetermined temperature. The values Ca1, Ca2, Ca3, Cb1, Cb2, Cb3, Cc1, Cc2 and Cc3 are set such that, according to $\Delta t$, the temperature of the portion below the center of the dispersion plate 234 becomes equal to the temperature adapted to the substrate processing and the temperature of the edge of the dispersion plate 234 is higher than that of the center of the dispersion plate 234, that is, higher than the temperature adapted to the substrate processing.

By providing the shower head heater 271 above the dispersion plate 234 as described above, it is possible to control the temperature of the dispersion plate 234 more reliably. Therefore, even when the maintenance step S112 is performed, it is possible to adjust the temperature of the substrate on the surface of the substrate, and it is also possible to adjust the temperature of the substrate between the lots. Therefore, it is possible to perform the substrate processing more reliably without variation. When a temperature distribution of the dispersion plate 234 becomes uniform, a second temperature adjusting step S122 may be performed.

Before performing the second temperature adjusting step S122, it is preferable to set the temperature of the center of the dispersion plate 234 higher than that of the edge of the dispersion plate 234 for the following reason. The reason is related to a positional relationship between the shower head heater 271 and the dispersion plate 234.

As shown in FIG. 1, a distance between the center of the dispersion plate 234 and the gas guide 270 is different from a distance between the edge of the dispersion plate 234 and the gas guide 270. Specifically, the gas guide 270 is configured such that the distance between the center of the dispersion plate 234 and the gas guide 270 is long and the distance between the edge of the dispersion plate 234 and the gas guide 270 is short. Due to the configuration of the gas guide 270, a distance between the center of the dispersion plate 234 and the shower head heater 271 is long and a distance between the edge of the dispersion plate 234 and the shower head heater 271 is short. Therefore, the influence of the shower head heater 271 in the center of the dispersion plate 234 is weaker than that that of the shower head heater 271 in the edge of the dispersion plate 234. Further, in the first temperature adjusting step S120, the substrate support 210 stands by at the transfer position. Therefore, the dispersion plate 234 is not easily affected by the heater 213.

Due to such a reason, the temperature of the center of the dispersion plate 234 is lower than that of the edge of the dispersion plate 234. Therefore, in the present step, the temperature of the center of the dispersion plate 234 may be set higher than that of the edge of the dispersion plate 234.

<Second Temperature Adjusting Step S122>

Subsequently, the second temperature adjusting step S122 will be described. When the temperature distribution of the dispersion plate 234 becomes uniform by performing the first temperature adjusting step S120, the shower head heater 271 is set so as to be compatible with the film-processing process. Specifically, the temperature of the center of the dispersion plate 234 is set to be lower than that of the edge of the dispersion plate 234. For example, the shower head heater 271 is set using the initial values Ca0, Cb0 and Cc0. By setting the shower head heater 271 in advance as described above, even when the temperature of the edge of the dispersion plate 234 is lowered in the present step, it is possible to uniformize the temperature distribution of the dispersion plate 234.

<Subsequent Lot Processing Transition Step S124>

Subsequently, the subsequent lot processing transition step S124 will be described. When the second temperature adjusting step S122 is completed, or when it is determined not to perform the maintenance step S112 in the determination step S110, or when it is determined not to perform the first temperature adjusting step S120 in the determination step S118, the subsequent lot processing transition step S124 is performed.

In the subsequent lot processing transition step S124, the substrate processing apparatus 100 is controlled based on the setting of the subsequent lot processing setting step S108. For example, the substrate S of the subsequent lot is loaded into the substrate processing apparatus 100. Then, k is increased by one, and the $k^{th}$ lot processing step S102 is performed.

As described above, before the first substrate (substrate serial number is S–1) of the subsequent lot is loaded, by adjusting the temperature to become close to a processing temperature of the last substrate (substrate serial number is S–m) of the current lot processed immediately before the subsequent lot, it is possible to eliminate the variation in the processing of the substrates between the lots (for example, between the current lot and the subsequent lot).

In particular, since the temperature of the center of the dispersion plate 234 is controlled to be higher than that of the edge of the dispersion plate 234 in the first temperature adjusting step S120, it is possible to uniformly heat the dispersion plate 234 while the temperature of the edge of the dispersion plate 234 does not become excessively high. Further, since the temperature of the edge of the dispersion plate 234 is controlled to be higher than that of the center of the dispersion plate 234 in the second temperature adjusting step S122, it is possible to eliminate the variation such as the temperature variation on the surface of the substrate in the film-forming process. As a result, it is possible to eliminate the variation between the lots.

Figure 10:
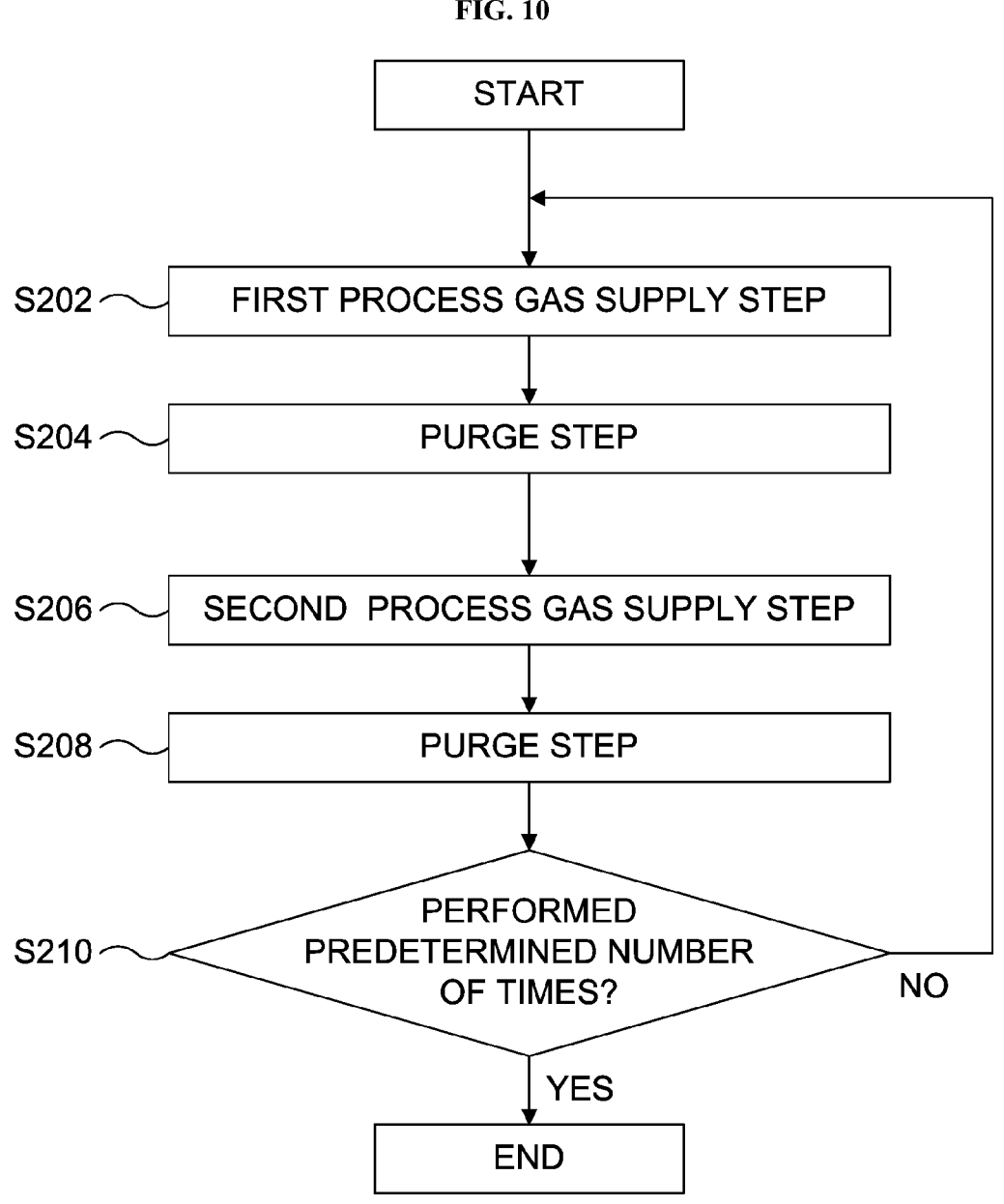
FIG. 10 is a flow chart schematically illustrating a film-forming step according to the embodiments described herein.

Hereinafter, as a part of the process of manufacturing a semiconductor device, the film-forming process of forming the film on the substrate S using the substrate processing apparatus 100 described above will be described with reference to FIG. 10. The film-forming process is a step of processing a substrate in the $k^{th}$ lot processing step S102. That is, in the $k^{th}$ lot processing step S102, the film-processing process is repeatedly performed for the number of the substrates processed in the $k^{th}$ lot.

The film-forming process of the present embodiment will be described by way of an example in which a silicon nitride film (also simply referred to as an "SiN film") serving as a semiconductor-based film is formed on the substrate S by alternately supplying dichlorosilane ($SiH_2Cl_2$, abbreviated as DCS) gas and ammonia ($NH_3$) gas onto the substrate S. That is, the DCS gas is used as the first element-containing gas (first process gas), and the $NH_3$ gas is used as the second element-containing gas (second process gas).

<Substrate Loading and Placing Step>

The substrate mounting table 212 is lowered to the transfer position of the substrate S such that the lift pins 207 penetrate through the through-holes 214 of the substrate mounting table 212. As a result, the lift pins 207 protrude from the surface of the substrate mounting table 212 by a predetermined height. In parallel with an operation of lowering the substrate mounting table 212, an inner atmosphere of the transfer space 206 is exhausted such that an inner pressure of the transfer space 206 is the same as that of the vacuum transfer chamber (not shown) provided adjacently or lower than that of the vacuum transfer chamber provided adjacently.

Subsequently, the gate valve 149 is opened to communicate the transfer space 206 with the vacuum transfer chamber (not shown) provided adjacently. Then, a vacuum transfer robot (not shown) loads the substrate S from the vacuum transfer chamber into the transfer space 206.

<Substrate Elevating Step>

After a predetermined time has elapsed, the substrate mounting table 212 is elevated until the substrate S is placed on the substrate placing surface 211. Then, the substrate mounting table 212 is further elevated until the substrate S reaches the substrate processing position as shown in FIG. 1.

<First Process Gas Supply Step S202>

After the substrate S is moved to the substrate processing position, an inner atmosphere of the process chamber 201 is exhausted through the exhaust pipe 262 to adjust an inner pressure of the process chamber 201 to a predetermined pressure.

When the temperature of the substrate S reaches a predetermined temperature, for example, ranging from 500° C. to 600° C. while adjusting the inner pressure of the process chamber 201 to the predetermined pressure, the first process gas is supplied to the process chamber 201 through the common gas supply pipe 242. While supplying the first process gas, the inner atmosphere of the process chamber 201 may be exhausted through the exhaust pipe 262. For example, the inner atmosphere of the process chamber 201 may be exhausted through an outer periphery of the substrate support 210. By supplying the DCS gas onto the substrate S in the process chamber 201, a silicon-containing layer is formed on the substrate S.

In the first process gas supply step S202, following the second temperature adjusting step S122, the temperature of the portion below the center of the dispersion plate 234 is controlled to become equal to the temperature adapted to the substrate processing, and the temperature of the edge of the dispersion plate 234 is controlled to be higher than that of the center of the dispersion plate 234, that is, higher than the temperature adapted to the substrate processing.

<Purge Step S204>

After the supply of the first process gas is stopped, the inert gas is supplied through the third gas supply pipe 245a to purge the process space 205. As a result, the first process gas that is not bonded to the substrate S in the first process gas supply step S202 is removed from the process space 205 through the exhaust pipe 262.

In the purge step S204, a large amount of the purge gas may be supplied to improve an exhaust efficiency in order to remove the first process gas remaining in the substrate S, the process space 205 and the buffer space 232.

<Second Process Gas Supply Step S206>

After the purge of the buffer space 232 and the process space 205 is completed, the second process gas supply step S206 is subsequently performed. In the second process gas supply step S206, the valve 244d is opened to supply the second process gas into the process space 205 via the plasma generator (that is, the remote plasma unit) 244e and the shower head 230. In the second process gas supply step S206, the MFC 244c is adjusted so that a flow rate of the second process gas is adjusted to a predetermined flow rate. For example, a supply flow rate of the second process gas is set to a predetermined supply flow rate ranging from 1,000 sccm to 10,000 sccm. Further, also in the second process gas supply step S206, the valve 245d of the third gas supplier 245 is opened to supply the inert gas through the third gas supply pipe 245a. By supplying the inert gas through the third gas supply pipe 245a, it is possible to prevent the second process gas from entering the third gas supplier 245.

The second process gas in the plasma state by the plasma generator 244e is supplied into the process space 205 through the shower head 230. The second process gas supplied into the process space 205 reacts with the silicon-containing layer on the substrate S. Thereby, the silicon-containing layer formed on the substrate S is modified by the plasma of the second process gas. As a result, for example, a silicon nitride layer (also simply referred to as an "SiN layer") is formed on the substrate S.

After a predetermined time has elapsed from the start of the supply of the second process gas, the valve 244d is closed to stop the supply of the second process gas. For example, a supply time (time duration) of supplying the second process gas is a predetermined supply time ranging from 2 seconds to 20 seconds.

<Purge Step S208>

After the supply of the second process gas is stopped, the purge step S208 similar to the purge step S204 described above is performed. The operations of the components of the substrate processing apparatus 100 in the purge step S208 is similar to those of the components in the purge step S204. Therefore, the detailed descriptions of the purge step S208 are omitted.

<Determination Step S210>

In the determination step S210, the controller 400 determines whether a cycle including the first process gas supply step S202, the purge step S204, the second process gas supply step S206 and the purge step S208 has been performed a predetermined number of times (n times). By performing the cycle the predetermined number of times, a silicon nitride film of a desired thickness is formed on the substrate S.

<Substrate Unloading Step>

After the silicon nitride film of the desired thickness is formed on the substrate S, the substrate mounting table 212 is lowered until the substrate S is moved to the transfer position. After moving the substrate S to the transfer position, the substrate S is unloaded out of the transfer space 206.

As described above, according to the present embodiment, even when the maintenance step S112 is performed, it is possible to adjust the temperature of the substrate on the surface of the substrate, and it is also possible to adjust the temperature of the substrate between the lots. Therefore, it is possible to perform the substrate processing without variation.

Second Embodiment

Subsequently, a second embodiment according to the technique of the present disclosure will be described. A first temperature adjusting step S120 of the second embodiment is different from that of the first embodiment. Thus, only portions different from those of the first embodiment will be described in detail below, and the description of portions the same as the first embodiment will be omitted.

Subsequently, the first temperature adjusting step S120 of the second embodiment will be described. Since the electrode 251 is made of a metal material, a heat absorption rate of the electrode 251 is high. Therefore, a temperature of the electrode 251 may be locally lowered. In such a case, the temperature of the shower head heater 271 in a region below the electrode 251 is controlled to be higher. For example, in FIGS. 1 and 3, the temperature of the intermediate portion 271b arranged below the electrode 251 is controlled so as to compensate for a decrease in the temperature caused by the electrode 251. For example, the shower head heater 271 is controlled so that the temperature of the region below the electrode 251 is higher than those of the other regions of the electrode 251.

As described above, according to the present embodiment, even when the maintenance step S112 is performed, it is possible to adjust the temperature of the substrate on the surface of the substrate, and it is also possible to adjust the temperature of the substrate between the lots. Therefore, it is possible to perform the substrate processing without variation.

Other Embodiments

While the technique of the present disclosure is described in detail by way of the embodiments described above, the above-described technique is not limited thereto. The above-described technique may be modified in various ways without departing from the gist thereof.

For example, the above-described embodiments are described by way of an example in which the temperature of the shower head 230 is detected by using the temperature detector 2821b and the temperature meter 2823b in the first temperature measuring step S104 and the second temperature measuring step S114. However, the above-described technique is not limited thereto. For example, a plurality of temperature detectors of the temperature detector 2821 and a plurality of temperature meters of the temperature meter 2823 may be used. In such a case, since the temperature distribution of the dispersion plate 234 can be detected more accurately, it is possible to uniformize the temperature distribution of the dispersion plate 234 more reliably.

For example, the above-described embodiments are described by way of an example in which the SiN film is formed on the substrate S by alternately supplying the DCS gas serving as the first element-containing gas (first process gas) and the $NH_3$ gas serving as the second element-containing gas (second process gas). However, the above-described technique is not limited thereto. For example, the process gases used in the film-forming process are not limited to the DCS gas and the $NH_3$ gas. That is, the above-described technique may also be applied to film-forming processes wherein other gases are used to form different films, or three or more different process gases are alternately supplied to form a film. Specifically, instead of silicon, an element such as titanium (Ti), zirconium (Zr) and hafnium (Hf) may be used as the first element. In addition, instead of nitrogen (N), an element such as argon (Ar) may be used as the second element.

For example, the above-described embodiments are described by way of an example in which the film-forming process is performed as the substrate processing of the substrate processing apparatus. However, the above-described technique is not limited thereto. That is, the above-described technique can be applied not only to the film-forming process of forming the film exemplified in the embodiments but also to a film-forming process of forming another film. For example, the specific content of the film-forming process are not limited to those exemplified in the embodiments. For example, in addition to the film-forming process or instead of the film-forming process, the above-described techniques may be applied to a process such as an annealing process, a diffusion process, an oxidation process, a nitridation process and a lithography process. The above-described technique may also be applied to other substrate processing apparatuses such as an annealing apparatus, an etching apparatus, an oxidation apparatus, a nitridation apparatus, an exposure apparatus, a coating apparatus, a drying apparatus, a heating apparatus, an apparatus using the plasma and combinations thereof. The above-described technique may also be applied when a constituent of one of the above-described examples is substituted with another constituent of other examples, or when a constituent of one of the above-described examples is added to other examples. The above-described technique may also be applied when the constituent of the examples is omitted or substituted, or when a constituent added to the examples.

Hereinafter, exemplary embodiments according to the above-described technique will be supplementarily noted.

Supplementary Note 1

A substrate processing apparatus including:
a process chamber in which a substrate is processed;
a shower head provided upstream of the process chamber;
a dispersion plate provided at the shower head;
a shower head heater capable of heating the dispersion plate;
a gas supplier configured to supply a gas to the substrate in the process chamber through the dispersion plate;
an exhauster configured to exhaust the gas from the process chamber;
a temperature meter configured to measure a temperature of the shower head; and
a controller configured to control the temperature meter and the shower head heater to measure the temperature of the shower head before loading a subsequent substrate to be processed into the process chamber, to compare the temperature of the shower head with a pre-set temperature, and to operate the shower head heater so as to control the temperature of the shower head to become close to the pre-set temperature when a difference between the temperature of the shower head and the pre-set temperature is greater than a predetermined value.

Supplementary Note 2

A non-transitory computer-readable recording medium storing a program that causes, by a computer, a substrate processing apparatus to perform:

(a) loading a substrate into a process chamber;
(b) supplying a gas to the substrate in the process chamber through a dispersion plate of a shower head provided upstream of the process chamber while heating the dispersion plate by a shower head heater and exhausting the gas from the process chamber;
(c) unloading the substrate out of the process chamber;
(d) measuring a temperature of the shower head before loading a subsequent substrate to be processed into the process chamber; and
(e) comparing the temperature of the shower head after (d) with a pre-set temperature, and operating the shower head heater so as to control the temperature of the shower head to become close to the pre-set temperature when a difference between the temperature of the shower head and the pre-set temperature is greater than a predetermined value.

As described above, according to some embodiments in the present disclosure, it is possible to uniformize the quality of the film among the plurality of substrates even when the processing environment among the plurality of substrates changes in the substrate processing apparatus configured to heat and process the plurality of substrates.

What is claimed is:

1. A substrate processing method, comprising:
(a) loading a substrate into a process chamber;
(b) supplying a gas to the substrate in the process chamber through a dispersion plate of a shower head provided upstream of the process chamber while heating the dispersion plate by a shower head heater and exhausting the gas from the process chamber; and
(c) unloading the substrate out of the process chamber,
wherein the shower head is provided with: the shower head heater configured to heat a central portion and an edge portion of the shower head; and an electrode provided in the shower head above both of the dispersion plate and the shower head heater,
wherein in (b), the shower head heater heats the central portion and the edge portion of the shower head such that a temperature of a region of the shower head heater that is below the electrode is higher than a temperature of the electrode, and
wherein in (b), the shower head heater heats the dispersion plate such that a temperature of a center of the dispersion plate is lower than a temperature of an edge of the dispersion plate.

2. The method of claim 1, wherein the substrate is placed on a substrate support provided below the shower head in (b), and the gas is exhausted through an outer periphery of the substrate support in (b).

3. The method of claim 1, further comprising:
(d) measuring a temperature of the shower head before loading a subsequent substrate to be processed into the process chamber; and
(e) comparing the temperature of the shower head after (d) with a pre-set temperature, and operating the shower head heater so as to control the temperature of the shower head to become close to the pre-set temperature when a difference between the temperature of the shower head and the pre-set temperature is greater than a predetermined value, and
wherein the predetermined value is larger than a value where substrate processing is affected by the difference.

4. The method of claim 3, wherein the shower head heater heats the dispersion plate such that the temperature of the edge of the dispersion plate in (b) is higher than a temperature of the edge of the dispersion plate in (e).

5. The method of claim 4, wherein the substrate is placed on a substrate support provided below the shower head in (b), and the gas is exhausted through an outer periphery of the substrate support in (b).

6. The method of claim 3, further comprising (f) performing a maintenance operation after performing (c) and before loading the subsequent substrate to be processed.

7. The method of claim 6, wherein the substrate processed in (b) belongs to an $n^{th}$ lot and the subsequent substrate to be processed belongs to an $(n+1)^{th}$ lot.

8. The method of claim 6, further comprising:

(g) adjusting the temperature of the shower head after (f).

9. The method of claim 6, wherein the temperature of the shower head in (f) is lower than that of the shower head in (b).

10. The method of claim 6, wherein the pre-set temperature is the temperature of the shower head in (b) before performing (f).

11. The method of claim 1, wherein the electrode is located only above the shower head heater.

12. The method of claim 1, wherein the shower head heater is provided around a gas introduction port and at a gas guide of a conic shape whose diameter increases along a radial direction of the substrate.

13. The method of claim 12, wherein the shower head heater provided at the gas guide comprises a plurality of zones, and the plurality of zones of the shower head heater are controlled separately for each zone such that a temperature of a surface of the dispersion plate is uniformly controlled in (b).

14. The method of claim 13, wherein one of the plurality of zones is provided below the electrode.

15. The method of claim 1, wherein the shower head heater is provided between the dispersion plate and the electrode along a direction of gravity.

16. A method of manufacturing a semiconductor device, comprising:

(a) loading a substrate into a process chamber;

(b) supplying a gas to the substrate in the process chamber through a dispersion plate of a shower head provided upstream of the process chamber while heating the dispersion plate by a shower head heater and exhausting the gas from the process chamber; and (c) unloading the substrate out of the process chamber, wherein the shower head is provided with: the shower head heater configured to heat a central portion and an edge portion of the shower head; and an electrode provided in the shower head above both of the dispersion plate and the shower head heater, wherein in (b), the shower head heater heats the central portion and the edge portion of the shower head such that a temperature of a region of the shower head heater that is below the electrode is higher than a temperature of the electrode, and wherein in (b), the shower head heater heats the dispersion plate such that a temperature of a center of the dispersion plate is lower than a temperature of an edge of the dispersion plate.

* * * * *